United States Patent [19]

Hayes et al.

[11] 4,241,300
[45] Dec. 23, 1980

[54] CIRCUIT RESPONSIVE TO RATE CHANGE IN AMPLITUDE OF ANALOG ELECTRICAL SIGNAL FOR USE IN TIRE PROCESSING APPARATUS

[75] Inventors: Richard H. Hayes, Tallmadge; Robert W. Herrmann, Alliance, both of Ohio

[73] Assignee: Eagle-Picher Industries, Inc., Cincinnati, Ohio

[21] Appl. No.: 780,610

[22] Filed: Mar. 24, 1977

[51] Int. Cl.³ .............................................. G05B 11/18
[52] U.S. Cl. .................................... 318/590; 318/636; 318/560; 73/146; 73/66; 73/460; 73/462; 157/13; 51/106 R; 51/DIG. 33; 51/165 R; 328/151; 307/353
[58] Field of Search ................... 73/146, 66, 460, 462, 73/475, 487; 157/13; 51/106 R, DIG.33, 165 R; 328/151; 307/353; 318/590, 591, 636, 560

[56] References Cited

U.S. PATENT DOCUMENTS

| | | | |
|---|---|---|---|
| 3,100,875 | 8/1963 | Peterson | 328/151 |
| 3,719,813 | 3/1973 | Friedman et al. | 73/146 |
| 3,835,591 | 9/1974 | Cimprich | 51/DIG. 33 |
| 3,839,650 | 10/1974 | Wood | 328/151 |

*Primary Examiner*—Gene Z. Rubinson
*Assistant Examiner*—Eugene S. Indyk

*Attorney, Agent, or Firm*—Wood, Herron & Evans

[57] ABSTRACT

An electronic circuit with an output that may be used, for example, to control a servo system which positions grinders of a tire grinding machine to correct tires with large cleats is disclosed. The electronic circuit is responsive to an analog electrical signal to detect whether or not the rate of change in amplitude of the analog electrical signal equals or exceeds a preselected limit. If the rate of change in amplitude of the analog electrical signal does not equal or exceed the preselected limit, the output of the electronic circuit has a characteristic that is similar to the analog electrical signal. If the rate of change in amplitude of the analog electrical signal equals or exceeds the preselected limit, the output of the electronic circuit preferably remains constant at an amplitude which the analog electrical signal attained prior to the change in amplitude at a rate equal to or in excess of the preselected limit. Broadly, the electronic circuit functions as a slope discrimination system which permits passage of an analog electrical signal if the rate of change in amplitude is below a predetermined rate but blocks passage of the analog electrical signal when the rate of change in amplitude reaches or surpasses the predetermined rate. Circuitry is preferably provided to adjustably preset the value for the preselected limit. Additional circuitry is preferably provided to facilitate automatic reset during operation.

18 Claims, 4 Drawing Figures

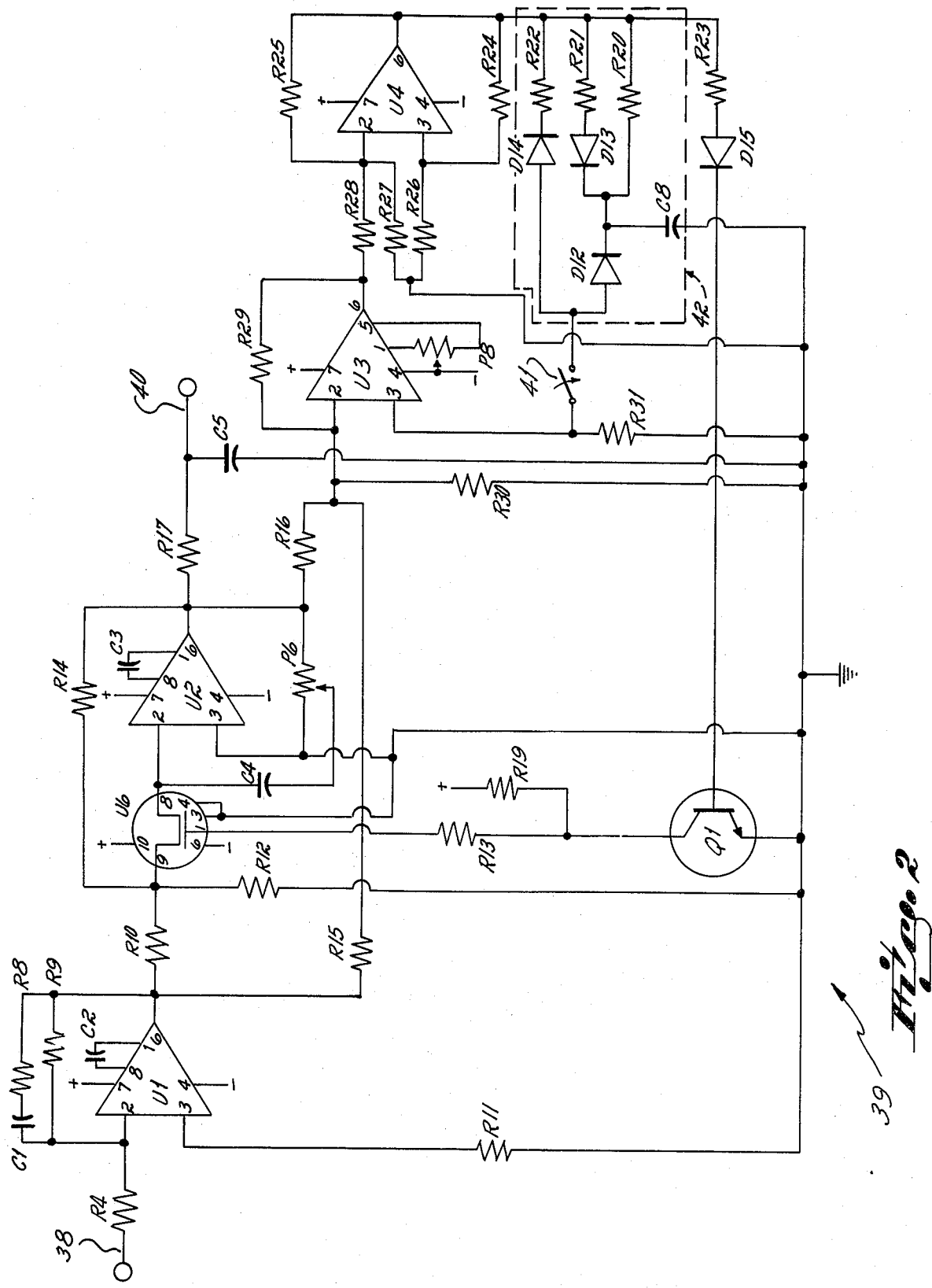

CIRCUIT RESPONSIVE TO RATE CHANGE IN AMPLITUDE OF ANALOG ELECTRICAL SIGNAL FOR USE IN TIRE PROCESSING APPARATUS

BACKGROUND OF THE INVENTION

This invention is directed to tire processing equipment and, more particularly, to an electronic circuit for use in such equipment. Specifically, this invention relates to an electronic circuit which is responsive to the rate of change in amplitude of an analog electrical signal that is representative, for example, of the surface configuration of a tire to detect when the rate of change in amplitude equals or exceeds a predetermined rate.

In the tire grinding machine of Hofelt, Jr. et al., "Means for Correcting Non-Uniformity in Tires," U.S. Pat. No. 3,724,137 (Apr. 3, 1973), wherein such an electronic circuit is not used, a sensor (numeral 87 in FIG. 3 and numeral 152 in FIG. 6) is employed to transduce the radial dimension of a tire. The output of the sensor controls a servo system to position grinders which correct force variations and/or eccentricity of a tire of the bias, radial, or wide-oval type.

A problem arises, however, if the output of the sensor in the Hofelt, Jr. et al. tire grinding machine is employed to control a servo system to position grinders to correct a lugtype tire, that is, a tire with large cleats. Often there is a relatively deep groove between lugs on a lug-type tire. The sensor does not distinguish lugs on a lug-type tire from abnormal variations in the radial dimension which occur in the road-contacting surface of the lugs on the tire. If the output of the sensor in the Hofelt, et al. tire grinding machine were used to control a servo system to position grinders to correct a lug-type tire, grinders might grind off lugs and destroy the tire.

In order to remedy this situation, an electronic circuit which is responsive to the rate of change in amplitude of the analog electrical signal from the sensor could be used to mask that portion of the analog electrical signal representative of grooves on a lug-type tire. Hence, the output of the electronic circuit could control a servo system to position grinders without grinding off lugs so that the tire grinding machine could be used to correct force variations and/or eccentricity in a lug-type tire.

Such an electronic circuit could also be used in combination with any other type of transducer which converts a physical condition into an analog electrical signal. A thermocouple to provide an analog electrical signal which is representative of a temperature, for example, could be used in combination with the electronic circuit to monitor a cooling system. If the rate of change in temperature were to equal or exceed a preselected limit, the electronic circuit could operate apparatus to indicate an abnormality.

An electronic circuit which is responsive to the rate of change in amplitude of an analog electrical signal also has many other applications. Such an electronic circuit could be used to detect, for example, an overvoltage or overcurrent transient condition on a power line. If the rate of change in amplitude of the voltage or current on the power line were to equal or exceed a preselected limit, the electronic circuit could operate protective devices so that equipment, such as motors that are connected to the power line, would not be damaged.

One objective of this invention is to provide an electronic circuit which is responsive to the rate of change in amplitude of an analog electrical signal to detect when the rate of change in amplitude equals or exceeds a predetermined limit.

A further objective of this invention is to provide an electronic circuit of the above type which is highly stable and yet which is sensitive to the rate of change in amplitude of an analog electrical signal.

An additional objective of this invention is to provide an electronic circuit to detect when the rate of change in amplitude of an analog electrical signal equals or exceeds a predetermined limit, wherein the predetermined limit may be adjustably preset.

Another objective of the present invention is to provide an electronic circuit to detect when the rate of change in amplitude of an analog electrical signal equals or exceeds a predetermined limit, wherein the electronic circuit is automatically reset after abatement of the condition in which the rate of change in amplitude equals or exceeds the predetermined limit.

A further objective of the present invention is to provide an electronic circuit to detect when the rate of change in amplitude of an analog electrical signal equals or exceeds a predetermined limit, wherein the electronic circuit has as an output the amplitude of the analog electrical signal at the time that the rate of change in amplitude equals or exceeds a predetermined limit until reset occurs.

An additional objective of the present invention is to provide an electronic circuit of the above type which is specially adapted for use in a tire grinding machine for lugtype tires, such as snow and truck tires.

SUMMARY OF THE INVENTION

An electronic circuit is provided which may be used, for example, in combination with a sensor in a tire grinding machine. The electronic circuit in that case is responsive to the transduced surface configuration of a tire. The electronic circuit distinguishes between lugs and grooves and abnormal variations in the radial dimension and produces an analog electrical signal which may control a servo system to position grinders in a tire grinding machine to correct the tire.

An analog electrical signal may enter the electronic circuit through an operational amplifier which provides gain. The analog electrical signal, or, in the case an operational amplifier is used, the output of the operational amplifier, is connected to two additional operational amplifiers in the electronic circuit. The first of these additional operational amplifiers is controlled by a first electronic switch such that in one state of the first electronic switch the first operational amplifier is configured as an inverter and in another state of the first electronic switch the first operational amplifier is configured as an integrator. The second of these additional operational amplifiers acts as a comparator and is connected to the analog electrical signal, or the output of the operational amplifier which provides gain, as the case may be, and to the inverter/integrator. The comparator is connected to another operational amplifier which acts as a detector. The detector is connected to a second electronic switch which controls the first electronic switch.

The electronic circuit detects a rate of change in amplitude of an analog electrical signal which equals or exceeds a predetermined limit. The analog electrical signal, or the output of the operational amplifier which provides gain, as the case may be, and the output of the inverter/integrator are connected to a common input of the comparator. When an analog electrical signal has a rate of change in amplitude which does not equal to exceed a predetermined limit, the first electronic switch is in a first state and the inverter/integrator is configured as an inverter. Consequently, there is zero voltage at the input of the comparator, since the analog electrical signal, or the output of the operational amplifier which provides gain, as the case may be, and the output of the inverter/integrator are opposite in polarity and equal in magnitude. When the analog electrical signal has a rate of change in amplitude which equals or exceeds the predetermined limit, a time constant in the inverter/integrator causes non-zero voltage to appear at the input of the comparator, since the analog electrical signal, or the output of the operational amplifier which provides gain, as the case may be, and the output of the inverter/integrator are opposite in polarity and have different magnitudes. Consequently, the comparator sets the detector. The detector in turn activates the second electronic switch. The second electronic switch preferably causes the first electronic switch to assume a second state. This converts the inverter/integrator to an integrator so that the inverter/integrator stores as an initial condition substantially the amplitude of the analog electrical signal at the time that the rate of change in amplitude of the analog electrical signal became equal to or exceeded the predetermined limit. The time constant of the inverter/integrator is preferably adjustable. This facilitates preset of the time constant of the inverter/integrator to establish the predetermined limit for rate of change in amplitude for any given application. The result is an electronic circuit that allows the passage of an analog electrical signal variation below a preselected rate of amplitude change and that blocks an analog electrical signal variation at or above the preselected rate of amplitude change and preferably stores the amplitude of the analog electrical signal which was attained before variation at or above the preselected rate.

Reset of the electronic circuit is effected upon recovery of the analog electrical signal to a preset threshold. Preferably, a reset circuit is included in a feedback path between the output of the detector and another input of the comparator so that reset occurs upon recovery of the analog electrical signal to the preset threshold regardless of the charactertistic of recovery of the analog electrical signal to the threshold. This is in case the analog electrical signal does not recover in a sufficient amplitude or at a rate which is required to effect reset of the electronic circuit.

The above and other objectives of the present invention will become better understood and the features and advantages of the present invention will become clear to those of skill in the art by consideration of a detailed description in connection with the drawing in which:

FIG. 2 is a schematic diagram of a preferred embodiment of the electronic circuit of the present invention; and FIG. 3 comprising

Figure 1:
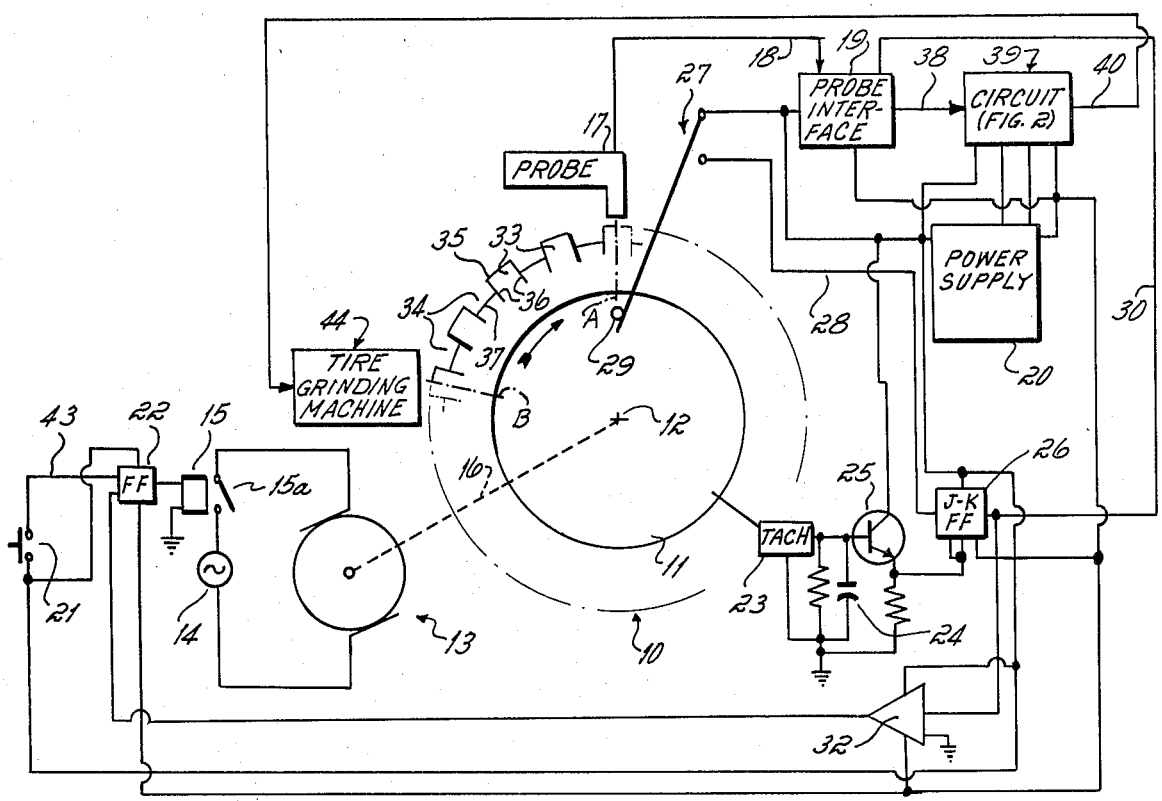
FIG. 1 is a block diagram of tire processing equipment which incorporates the electronic circuit of the present invention to illustrate an application of the electronic circuit of the present invention and to facilitate an understanding of the operation thereof.

With reference to FIG. 1, the electronic circuit of the present invention will be described in connection with an exemplary use in tire processing equipment. Description of the electronic circuit of the present invention as applied in connection with the tire processing equipment of FIG. 1 is intended to make the features and advantages of the electronic circuit of the present invention more understandable. Such a use of the electronic circuit of the present invention is exemplary only and is in no way meant to restrict the scope of the present invention.

In FIG. 1, a tire 10 is mounted on a rotatable drum 11. Drum 11 is adapted to be rotated about an axis 12. A motor 13 is adapted to be energized by a voltage source 14 when a switch 15a is closed. Motor 13 may be a synchronous motor. The shaft 16 of motor 13 is connected by means of a clutch assembly, gear box, etc. (not shown) to drum 11 so as to rotate drum 11 when switch 15a is closed.

As shown in FIG. 1, a transducer 17 is mounted by any convenient means, such as on a bracket (not shown), in proximity to the circumferential surface of tire 10. Transducer 17 may be of the contact, or paddle, type, such as the sensor used in aforementioned U.S. Pat. No. 3,724,137. Preferably, transducer 17 is of the non-contact type.

Although various types of non-contact transducers are known in the prior art, a capacitive probe, such as an ADE 2221 capacitive probe, has proved satisfactory. Other types of non-contact transducers, however, such as optical, sonic, electromagnetic, etc. transducers may be used. Non-contact transducers are preferred over contact transducers since non-contact transducers require less maintenance and have greater longevity.

With reference to FIG. 1, the output of transducer 17 is connected via lead 18 to an interface circuit 19. In the case that an ADE 2221 capacitive probe is used for transducer 17, interface circuit 19 may be an ADE 16-C213-1560-X03 in combination with an ADE 16-C213-1550-01. Power requirements for interface circuit 19 are supplied by a power supply 20.

To render the description more clear, a control circuit is included so that transducer 17 generates an analog electrical signal that is easily recognizable as the circumferential surface configuration of tire 10. Specifically, switch 15a may be the normally open contact of a relay 15. A momentary switch 21 momentarily connects power supply 20 to the set terminal of a flip-flop 22 via lead 43. Flip-flop 22 assumes a logic "1" state and activates relay 15 so as to close normally open contact 15a. Consequently, motor 13 is energized to rotate drum 11.

A tachometer 23 transduces the speed of rotation of drum 11. When drum 11 reaches synchronous speed, a voltage across capacitor 24 forward biases an NPN transistor 25. Consequently, the J and k terminals of a J-k flip-flop 26 are enabled.

The clock input of J-k flip-flop 26 is connected to a microswitch 27. Microswitch 27 is adapted to provide a pulse to the clock input of J-k flip-flop 26 over lead 28 each time a post 29 on drum 11 contacts microswitch 27.

If drum 11 is at synchronous speed, as indicated by enablement of the J and k terminals of J-k flip-flop 26, successive pulses from microswitch 27 cause J-k flip-flop 26 to first transpose from a logic "0" state to a logic "1" state and then to transpose back to a logic "0" state.

When J-k flip-flop 26 transposes to the logic "1" state, interface circuit 19 is enabled due to the connection of J-k flip-flop 26 to the enable terminal of interface circuit 19 via lead 30. Consequently, the analog electrical signal in FIG. 3a appears on lead 38 at the output of interface circuit 19. The FIG. 3a waveform represents a section of the circumferential surface configuration of tire 10.

When J-k flip-flop 26 transposes back to the logic "0" state after the circumferential surface configuration of tire 10 is transduced, inverter 32 resets flip-flop 22. Flip-flop 22 assumes a logic "0" state and deactivates relay 15. Switch 15a returns to the normally open position so as to de-energize motor 13.

As shown in FIG. 1, tire 10 represents a lug-type tire, that is, a snow or truck tire, with alternate lugs 33 and grooves 34 between lugs. Each lug 33 has a plateau 35 and oppositely disposed sides 36. Lugs 33 are spaced apart so as to have a region 37 therebetween. Generally, plateaus 35 of lugs 33 are intended to be the road-contacting surfaces of tire 10. Moreover, plateaus 35 of lugs 33 constitute the area of the surface of tire 10 with reference to which grinders must be positioned in order to correct force variations and/or eccentricity by means of a tire grinding machine 44 as described hereinafter.

Figure 3A:
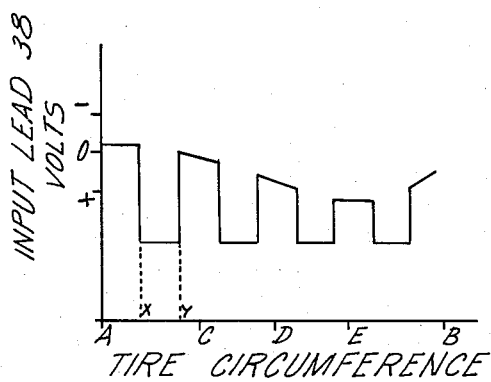
FIGS. 3a and 3b, is a graph of analog electrical signals input to and output from the electronic circuit of the present invention. In the drawing, like reference numerals indicate like elements.

In FIG. 3a is shown as analog electrical signal which represents a section of the circumferential surface configuration of tire 10 in FIG. 1, such as from point A to point B on tire 10. The variations in height across plateau 35 of each lug 33 and variations in height of lugs 33 on tire 10 from A to B are apparent in FIG. 3a. These variations may contribute to force variations in, as well as eccentricity of, tire 10. Consequently, a tire grinding machine 44 might be used to correct force variations and/or eccentricity of tire 10.

If the analog electrical signal in FIG. 3a were input directly to a servo system to position grinders of tire grinding machine 44, grinders would be incorrectly positioned with respect to tire 10, and destruction of tire 10 could result. This derives from the fact that the regions 37 as well as the plateaus 35 of lugs 33 constitute the surface of tire 10, such that grinders could conceivably be positioned to grind regions 37 to correct tire 10. This would result in removal of substantial amounts of material from lugs 33 and destroy tire 10.

Consequently, the analog electrical signal in FIG. 3a is input via lead 38 from interface circuit 19 to an electronic circuit 39 in accordance with the present invention, as shown in FIG. 1. Electronic circuit 39 converts the analog electrical signal in FIG. 3a into the analog electrical signal in FIG. 3b which appears on lead 40 at the output of electronic circuit 39 in FIG. 1. Before description of conversion of the waveform of FIG. 3a into the waveform of FIG. 3b, the structure of a preferred embodiment of electronic circuit 39 will first be described.

A preferred embodiment for electronic circuit 39 of the present invention will be described in connection with the schematic diagram of FIG. 2. For the purpose of simplification of FIG. 2, power requirements are indicated generally by + and −, and may be supplied by power supply 20, as shown in FIG. 1.

As shown in FIG. 2, input lead 38 is preferably connected by an input resistor R4 to the inverting input of an operational amplifier U1. The noninverting input of operational amplifier U1 is connected by a resistor R11 to common, or ground. The output and the inverting input of operational amplifier U1 are interconnected by the combination of a resistor R9 in parallel with a series-connected resistor R8 and capacitor C1. Operational amplifier, or inverter, U1 merely provides gain and also a filter for high frequency, or short time interval, variations, such as due to noise.

The output of inverter U1 is connected by an input resistor R15 to the inverting input of an operational amplifier U3. The output of inverter U1 is also connected by a resistor R10 to the source of a field-effect transistor (FET) U6. A bias resistor R12 connects the source of FET U6 to common. FET U6 is preferably of the type wherein the source-to-drain resistance is high when a positive voltage appears at the gate, and the source-to-drain resistance is low when a zero or negative voltage appears at the gate. Thus, FET U6 effectively operates as a switch, which is "ON" when a zero or negative voltage appears at the gate and which is "OFF" when a positive voltage appears at the gate.

The drain of FET U6 is connected to the inverting input of an operational amplifier U2. The noninverting input of operational amplifier U2 is connected to common. A resistor R14 is connected from the output of operational amplifier U2 to the source of FET U6. The output and the inverting input of operational amplifier U2 are interconnected by the series combination of a variable resistance P6 and a capacitor C4, one side of variable resistance P6 being connected to the output of operational amplifier U2 and the other side of variable resistance P6 being connected to common.

When FET U6 is "ON", the output and the inverting input of operational amplifier U2 are interconnected by the combination of resistor R14 (via the source-to-drain path of FET U6) in parallel with series-connected variable resistance P6 and capacitor C4. Consequently, when FET U6 is "ON", operational amplifier U2 has a configuration similar to inverter U1.

When FET U6 is "OFF", however, resistor R14 is effectively removed from across series-connected variable resistance P6 and capacitor C4. Operational amplifier U2 assumes a configuration similar to an integrator, which has an initial condition closely approximating the amplitude of the analog electrical signal which appears at the inverting input of operational amplifier U2 before FET U6 switches "OFF". Because of the high input impedance of operational amplifier U2 and the high impedance of the source-to-drain path of FET U6, when the latter is "OFF", the discharge circuits for capacitor C4 are effectively removed, and the voltage across capacitor C4 remains at the amplitude of the analog electrical signal at the inverting input of operational amplifier U2 before FET U6 switches "OFF".

Output lead 40 of electronic circuit 39 coincides with the output of a filter, which comprises a resistor R17 and a capacitor C5, at the output of operational amplifier U2. The filter attenuates high frequency components in the output of operational amplifier U2.

The output of operational amplifier U2 is also connected by an input resistor R16 to the inverting input of operational amplifier U3. The inverting and the noninverting inputs of operational amplifier U3 are connected to common by resistors R30 and R31, respectively. A resistor R29 is connected between the output and the inverting input of operational amplifier U3 to provide negative feedback. Preferably, a variable resistance P8, which is connected to a negative DC voltage supply, provides a bias, or threshold, for operational amplifier, or comparator, U3.

The output of comparator U3 is connected by an input resistor R28 to the inverting input of operational amplifier U4. The inverting and the noninverting inputs of operational amplifier U4 are connected to common by resistors R27 and R26, respectively. A resistor 25 connects the output of operational amplifier U4 to the inverting input of same. The output and the noninverting input of operational amplifier U4 are interconnected by a resistor R24. Resistor R24 preferably has a higher ohmic value than resistor R25. When no analog electrical signal appears at the inverting input of operational amplifier U4, therefore, the output of operational amplifier U4 is positive so as to forward bias an NPN transistor Q1 by means of the connection of the output of operational amplifier, or detector, U4 to the base of NPN transistor Q1 via a resistor R23 and the anode-cathode path of diode D15.

When NPN transistor Q1 is forward-biased, its collector, which is connected by resistor R13 to the gate of FET U6, is at common potential. Consequently, FET U6 is "ON". When NPN transistor Q1 is reverse-biased, however, its collector, which is connected to a positive DC voltage supply by a current-limiting resistor R19, is at positive potential. Consequently, FET U6 is "OFF".

Preferably, a switch 41 is closed so as to connect a reset circuit 42 between the output of detector U4 and the non-inverting input of comparator U3. When the output of detector U4 is negative, a capacitor C8 is negatively charged through a resistor R20. The negative voltage at the output of detector U4 is fed back to the noninverting input of comparator U3 via a resistor R22 and the cathode-anode path of a diode D14, and the voltage across capacitor C8 is fed back to the noninverting input of comparator U3 through the cathode-anode path of a diode D12. This negative feedback in combination with the negative feedback through resistor 29 reduces the dead band of comparator U3 when the output of detector U4 is negative. Capacitor C8 is discharged, or positively charged, through a resistor R21 and the anode-cathode path of a diode D13 in parallel with resistor R20 when the output of detector U4 is positive. Diodes D12 and D14, however, block the feedback of any positive voltage to the noninverting input of comparator U3.

The operation of electronic circuit 39 will now be described in connection with FIGS. 2 and 3. As shown in FIG. 3a, a section of the circumferential surface configuration of tire 10 in FIG. 1 is represented by an analog electrical signal. The analog electrical signal, as indicated above, is transduced by rotation of tire 10 from point A to point B (in the direction of the arrow) in FIG. 1. By using a waveform obtained in this manner, it is hoped that the correlation between FIGS. 1 and 3a will be more clear and that the operation of electronic circuit 39 of the present invention will be better understood.

As shown in FIG. 3a, the analog electrical signal from A to C, from C to D, from D to E, and from E to B has a somewhat repetitive form. From A to C, for example, the analog electrical signal is representative of the circumferential surface configuration of tire 10 across a section of plateau 35 and down one side 36 of a first lug 33, then across a region 37 between the first and a second lug 33, and then up one side 36 and across a section of plateau 35 of the second lug 33. A similar cycle is repeated from C to D, from D to E, and from E to B. Consequently, the operation of electronic circuit 39 of the present invention need only be described for one cycle of operation, such as from A to C in FIG. 3a.

For the purpose of discussion, it will be assumed that, at a time prior to the time that point A on tire 10 is transduced, interface circuit 19 is disabled and zero voltage appears on input lead 38 in FIG. 1. Consequently, with reference to FIG. 2, zero voltage will appear at the inverting input of comparator U3. As noted above, resistors R24 and R25 are in a ratio such that detector U4 in the absence of a positive voltage at its inverting input will produce a positive voltage at its output. Consequently, a positive voltage appears at the output of detector U4 which forward biases NPN transistor Q1 so that the collector of NPN transistor Q1 is at common potential and FET U6 is "ON".

With reference to FIG. 3a, at point A, the analog electrical signal is negative. Negative voltage, therefore, initially appears at the inverting input of inverter U1, and a positive voltage consequently appears at the output of inverter U1.

Figure 3B:
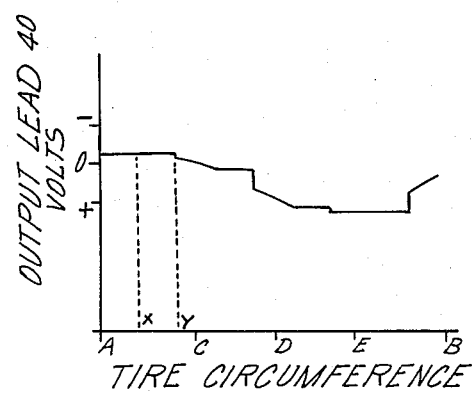

Since FET U6 is "ON", operational amplifier U2 is configured to act as an inverter. Consequently, operational amplifier U2 converts the positive voltage, which is connected through resistor R10 and the source-to-drain path of FET U6 to the inverting input of operational amplifier U2, to a negative voltage at the output of operational amplifier U2. As a result, the voltage at the output of operational amplifier U2 is as shown in FIG. 3b.

Insofar as control of FET U6 is concerned, the positive voltage at the output of inverter U1 and the negative voltage at the output of operational amplifier U2 are of substantially the same magnitude so that an approximately zero voltage appears at the inverting input of comparator U3. Consequently, the output of detector U4 is positive so that NPN transistor Q1 is forward-biased and FET U6 remains "ON".

At X, the analog electrical signal in FIG. 3a increases sharply positive. Consequently, inverter U1 converts the positive-going voltage at its inverting input to a negative-going voltage at its output. Since FET U6 is "ON" a negative-going voltage appears at the inverting input of operational amplifier U2. Due to the time constant of capacitor C4 and variable resistance P6, however, a time delay is interposed such that the amplitude of the positive-going voltage at the output of operational amplifier U2 does not effectively cancel the amplitude of the negative-going voltage at the output of inverter U1. As a result, the voltage at the inverting input of comparator U3 goes below threshold so that the output of comparator U3 becomes positive.

When the output of comparator U3 becomes positive, a positive voltage appears at the inverting input of detector U4. This means that the output of detector U4 becomes negative so as to reverse-bias NPN transistor Q1. As a result, a positive voltage appears at the collector of NPN transistor Q1. FET U6, therefore, switches "OFF".

When a positive-going voltage appears on input lead 38 of electronic circuit 39, FET U6 switches almost instantaneously from "ON" to "OFF". When this occurs, operational amplifier U2 changes configuration from an inverter to an integrator. As a result, substantially the amplitude of the analog electrical signal prior to switching of FET U6 is stored by capacitor C4. Since switching of FET U6 effectively removes the discharge circuits for capacitor C4, the output of operational amplifier U2 remains at the voltage across capacitor C4 as shown in FIG. 3b at X.

With reference to FIG. 3b, the output of electronic circuit 39 remains fixed at the voltage at X as the groove 34 between adjacent lugs 33 is transduced. This is in contra-distinction to the analog electrical signal in FIG.

3a, which continues to vary in accordance with the circumferential surface configuration of tire 10 in FIG. 1.

If switch 41 in FIG. 2 is open, FET U6 remains "OFF" so long as a positive-going voltage appears at the inverting input of inverter U1. When the sum of the negative-going voltage at the output of inverter U1 and the voltage across capacitor C4 exceeds the threshold that is established by variable resistance P8, comparator U3 provides a zero output which causes detector U4 to produce a positive voltage at its output so that NPN transistor Q1 becomes forward-biased and FET U6 switches "ON" again. When FET U6 switches "ON" again, operational amplifier U2 re-assumes the configuration of an inverter. Thereafter, the output of operational amplifier U2 provides an analog electrical signal representative of plateau 35 of adjacent lug 33, for example, from Y to C in FIG. 3b, and electronic circuit 39 operates analogously to its performance from A to X.

Preferably, switch 41 in FIG. 2 is closed. This connects reset circuit 42 (R20, R21, R22, C8, D12, D13, D14) between the output of detector U4 and the noninverting input of comparator U3. The purpose of reset circuit 42 is to generate a timed reset pulse for detector U4 when FET U6 is "OFF".

When FET U6 is "ON", reset circuit 42 is effectively removed from the noninverting input of comparator U3. Specifically, when FET U6 is "ON", this means that the output of detector U4 is positive. Feedback of the positive voltage at the output of detector U4 is prevented by blocking diodes D12 and D14.

When, however, FET U6 is "OFF", this means that the output of detector U4 is negative. Capacitor C8 charges negatively through resistor R20. Feedback of negative voltage across capacitor C8 to the noninverting input of comparator U3 results through the cathode-anode path of diode D12. Moreover, negative voltage is fed back from the output of detector U4 through resistor R22 and the cathode-anode of path of diode D14 to the noninverting input of comparator U3.

The feedback of negative voltage to the noninverting input of comparator U3 is at a rate which is correlated to the time constant of resistor R20 and capacitor C8. Since there is negative feedback through resistor R29, the feedback of negative voltage to the noninverting input of comparator U3 will cause the output of comparator U3 to in time become zero unless the voltage at the inverting input of comparator U3 is negative-going. The voltage at the inverting input of comparator U3 is negative-going when the analog electrical signal represents downward sloping sides 36 from plateaus 35 to regions 37 of lugs 33 but is not negative-going when the analog electrical signal represents regions 37 and/or upward sloping sides 36 from regions 37 to plateaus 35 of lugs 33.

In the event that reset circuit 42 does not cause the output of comparator U3 to change from positive to zero, the output of detector U4 remains negative. Consequently, FET U6 remains "OFF", and a voltage continues to be stored by capacitor C4 as described above.

In the event, however, that reset circuit 42 causes the output of comparator U3 to change from positive to zero, the output of detector U4 changes from negative to positive. When the output of detector U4 becomes positive, FET U6 switches "ON" so as to reconvert operational amplifier U2 to an inverter.

Since, however, the positive voltage at the output of detector U4 discharges capacitor C8 through resistor R20 and series-connected resistor R21 and diode D13, unless the voltage at the inverting input of comparator U3 is below the threshold established by variable resistance P8, the output of comparator U3 changes back to positive immediately. This in turn causes the output of detector U4 to change back to negative, and FET U6 is switched "OFF" again. Consequently, operational amplifier U2 again assumes the configuration of an integrator. Since the time constant of resistors R20 and R21 and capacitor C8 is short as compared to the time constant of resistors P6 and R14 and capacitor C4, the voltage across capacitor C4 remains substantially unchanged.

If, however, the voltage at the inverting input of comparator U3 exceeds the threshold established by variable resistance P8, FET U6 will remain "ON". In effect, reset circuit 42 generates timed reset pulses when FET U6 is "OFF". This is to guard against the case where the voltage at the inverting input of comparator U3 does not recover to threshold voltage in an amplitude or at a rate which is sufficient to reset FET U6 to "ON". Reset circuit 42 might be needed, for example, in the case of gradually upwardly sloping sides 36 from regions 37 to plateaus 35 of lugs 33 on some tires. The variable resistance P6 preferably can be adjusted such that a change in amplitude of an analog electrical signal on input lead 38 equal to or greater than any preselected rate will cause FET U6 to switch from "ON" to "OFF", thereby trapping a voltage across capacitor C4. When this occurs, the voltage across capacitor C4 is at substantially the amplitude of the analog electrical signal prior to the point in time that FET U6 switches from "ON" to "OFF". As a result, the waveform in FIG. 3a becomes the waveform in FIG. 3b.

By way of a specific construction for the electronic circuit in FIG. 2, the types and values in Table I may, for example, be assigned to the elements.

Table I

| U1-U2 | 3130AT |
|---|---|
| U3-U4 | LM741CN |
| U6 | DG200BA |
| Q1 | 2925 |
| D12, D14-D15 | 1N457 |
| D13 | 1N270 |
| P6, P8 | Bourns 10kΩ 4 turn |
| C1 | 0.001μf |
| C2-C3 | 0.033μf |
| C4-C5 | 0.22μf |
| C8 | 1.0μf |
| R8-R9 | 20kΩ |
| R4, R10, R12-R14, R17, R19, R28, R30-R31 | 10kΩ |
| R11 | 4.7kΩ |
| R15-R16 | 100kΩ |
| R26-R27 | |
| R20, R23 | 68kΩ |
| R21 | 15kΩ |
| R22, R25 | 1MΩ |
| R24, R29 | 470kΩ |

The structure of FIG. 2 is only one embodiment of the electronic circuit 39 of the present invention. As will readily occur to those of skill in the art, electronic circuit 39 in FIG. 2 could be constructed with elements which utilize a reverse polarity and/or equivalent elements could be substituted for those that appear in FIG. 2. Such modifications are clearly within the scope of the present invention.

In addition, it will be apparent to those of skill in the art that the electronic circuit in FIG. 2 could be implemented by use of a microprocessor specially programmed to perform the operation of the electronic circuit in FIG. 2. Such a software embodiment is also within the scope of the present invention.

The electronic circuit of the present invention has been described in connection with a sensor for use in a tire grinding machine 44 for grinding lug-type tires. Thus, an analog electrical signal representative of the circumferential surface configuration of a tire, such as in FIG. 3a, is converted into an analog electrical signal, such as in FIG. 3b, so that the grooves between lugs do not cause erroneous grinding of a lug-type tire. Of course, those of skill in the art will be aware of many diverse uses for the electronic circuit of the present invention, such as a transient detector. Thus, the scope of this invention is not intended to be restricted to the exemplary use which is described.

Having described the invention, we claim:

1. An electronic circuit for detecting an analog electrical signal having a rate of change in amplitude equal to or greater than a predetermined rate, comprising:
   first connection means for connecting an analog electrical signal from an external source to a) circuit means having a time constant and to b) a first input of a comparator;
   said circuit means being responsive in a first state to said analog electrical signal for inverting said analog electrical signal;
   second connection means for connecting said inverted analog electrical signal from said circuit means to said first input of said comparator;
   said time constant being effective to produce a difference signal at said first input of said comparator whenever the rate of change in amplitude of said analog electrical signal is not less than a predetermined rate, said difference signal causing said comparator to produce an indication signal whenever said rate of change is at least equal to said predetermined rate;
   a switch alternatively operative in a first mode and a second mode;
   switch control means connected to said switch for controlling said switch; and
   third connection means for connecting said comparator to said switch control means;
   said switch control means being responsive to place said switch in said first mode in the absence of said indication signal and being responsive to place said switch in said second mode in the presence of said indication signal;
   said switch being operative in said first mode to cause said circuit means to assume said first state for inverting said analog electrical signal;
   said switch being operative in said second mode to cause said circuit means to assume a second state for storing the amplitude of said analog electrical signal at the time said indication signal is produced.

2. The electronic circuit of claim 1, wherein said circuit means includes a variable impedance for adjustable preselection of said time constant.

3. The electronic circuit of claim 1, wherein said comparator includes threshold means for establishing a threshold, and wherein said comparator produces said indication signal only when said difference signal bears a predetermined relation to said threshold.

4. The electronic circuit of claim 3, further including:
   a reset circuit, having a delay, connected between said switch control means and a second input of said comparator and operative in the presence of said indication signal to cause said switch control means to place said switch from said second mode to said first mode upon recovery of said analog electrical signal to said threshold;
   whereby said switch is reset in case said analog electrical signal does not otherwise recover to said threshold with a characteristic that is sufficient to effect reset of said switch.

5. An electronic circuit for detecting an analog electrical signal having a rate of change in amplitude equal to or greater than a predetermined rate, comprising:
   means for connecting an analog electrical signal from an external source to an input of a first switch;
   circuit means, having a time constant, connected to an output of said first switch for inverting said analog electrical signal when said first switch is in a first state and for storing an amplitude of said analog electrical signal when said first switch is in a second state;
   a comparator having a first input connected to said means for connecting and to an output of said circuit means;
   threshold means connected to said comparator for establishing a threshold for said comparator;
   said time constant being effective to produce a difference signal at said first input of said comparator whenever the rate of change in amplitude of said analog electrical signal is not less than a predetermined rate;
   said difference signal causing said comparator to produce an indication signal whenever said difference signal bears a predetermined relation to said threshold; and
   switch control means, including:
      (a) a detector/and
      (b) a second switch, said detector having an input connected to said comparator and an output connected to a control terminal of said second switch, said second switch having an output connected to a control terminal of said first switch;
   said switch control means in the absence of said indication signal being operative to place said first switch in said first state and in the presence of said indication signal being operative to place said first switch in said second state;
   said first switch being reset to said first state when said analog electrical signal recovers to said threshold.

6. The electronic circuit of claim 5, wherein said circuit means includes a variable impedance for adjustable preselection of said time constant.

7. The electronic circuit of claim 5, further including:
   a reset circuit, having a delay, connected between said output of said detector and a second input of said comparator;
   said reset circuit being operative in the presence of said indication signal to cause said switch control means to reset said first switch to said first state after said delay, provided that said analog electrical signal has recovered to said threshold;
   whereby said first switch is reset in case said analog electrical signal does not otherwise recover to said threshold with a characteristic that is sufficient to effect reset of said first switch.

8. The electronic circuit of claim 1, wherein said external source is a transducer and said analog electrical signal represents the circumferential surface configuration of a tire, and wherein said circuit means has an output, further including:
tire grinding apparatus, including:
(a) at least one grinder and
(b) means for positioning said at least one grinder, said means for positioning being responsive to said output of said circuit means to position said at least one grinder.

9. The electronic circuit of claim 8, wherein said circuit means includes a variable impedance for adjustable preselection of said time constant.

10. The electronic circuit of claim 8, wherein said comparator includes threshold means for establishing a threshold, and wherein said comparator produces said indication signal only when said difference signal bears a predetermined relation to said threshold.

11. The electronic circuit of claim 10, further including:
a reset circuit, having a delay, connected between said switch control means and a second input of said comparator and operative in the presence of said indication signal to cause said switch control means to place said switch from said second mode to said first mode upon recovery of said analog electrical signal to said threshold;
whereby said switch is reset in case said analog electrical signal does not otherwise recover to said threshold with a characteristic that is sufficient to effect reset of said switch.

12. A method for detecting an analog electrical signal having a rate of change in amplitude equal to or greater than a predetermined rate, including the steps of:
inputing an analog electrical signal to a circuit means having a time constant;
inverting the analog electrical signal, when the circuit means are in a first mode, to produce an inverted electrical signal;
inputing the inverted electrical signal to a first terminal of a comparator;
inputing the analog electrical signal to the first terminal of the comparator;
producing in the comparator an indication signal that the rate of change in amplitude of the analog electrical signal is not less than a predetermined rate;
switching the circuit means to a second mode in response to the indication signal; and
storing the amplitude of the analog electrical signal at the time the indication signal is produced when the circuit means is switched to the second mode.

13. The method of claim 12, further including the steps of:
establishing a threshold for the comparator; and
producing in the comparator an indication signal only when the sum of the analog electrical signal and the inverted electrical signal at the first terminal of the comparator bears a predetermined relation to the threshold.

14. The method of claim 13, further including the step of:
switching the circuit means back to the first mode when the analog electrical signal recovers to the threshold.

15. A method for generating an input to the grinder positioning apparatus of a tire grinding machine for grinding lug-type tires, including the steps of:
transducing the circumferential surface configuration for a lug-type tire to produce an analog electrical signal;
outputing the analog electrical signal to a circuit means having a time constant;
inverting the analog electrical signal, when the circuit means is in a first mode, to produce an inverted electrical signal;
outputing the inverted electrical signal to a first terminal of a comparator;
outputing the analog electrical signal to the first terminal of the comparator;
producing in the comparator an indication signal whenever the rate of change in amplitude of the analog electrical signal is not less than a predetermined rate;
switching the circuit means to a second mode in response to the indication signal;
storing the amplitude of the analog electrical signal at the time the indication signal is produced when the circuit means is switched to the second mode; and
using the output of the circuit means in the first and second modes as the input to the grinder positioning apparatus.

16. In combination with apparatus for grinding lug-type tires, an electronic circuit, comprising:
circuit means responsive to the circumferential surface configuration of a lug-type tire for distinguishing lugs from grooves on said tire;
said circuit means having an output, said output changing in response to radial variations in said tire due to differences in the radial dimension of said lugs, said output not changing in response to radial variations in said tire due to grooves present between said lugs;
said output for controlling a tire grinding machine so that said tire grinding machine is positioned in response to radial variations in said tire due to differences in the radial dimension of said lugs but not in response to radial variations in said tire due to grooves present between said lugs;
whereby non-uniformities in said tire can be corrected.

17. A system for grinding lug-type tires, comprising:
tire grinding apparatus, including:
(a) at least one grinder and
(b) means for positioning said at least one grinder;
a transducer for generating an analog electrical signal representative of the circumferential surface configuration of a lug-type tire; and
circuit means responsive to said analog electrical signal for distinguishing lugs from grooves on said tire;
said circuit means having an output, said output changing in response to radial variations in said tire due to differences in the radial dimension of said lugs, said output not changing in response to radial variations in said tire due to grooves present between said lugs;
said means for positioning being responsive to said output to position said at least one grinder so that said grinder is positioned in response to radial variations in said tire due to differences in the radial dimension of said lugs but not in response to radial variations in said tire due to grooves present between said lugs;
whereby non-uniformities in said tire can be corrected.

18. A method for grinding lug-type tires, including the steps of:
- distinguishing lugs on a lug-type tire from grooves on the tire;
- deriving an analog electrical signal in which the grooves are masked, the analog electrical signal changing in response to radial variations in the tire due to differences in the radial dimension of the lugs, the analog electrical signal not changing in response to radial variations in the tire due to grooves present between the lugs; and
- controlling a tire grinding machine with the analog electrical signal so that the tire grinding machine is positioned in response to radial variations in the tire due to differences in the radial dimension of the lugs but not in response to radial variations in the tire due to grooves present between the lugs;

thereby correcting non-uniformities in the tire.

* * * * *